US009982866B2

(12) United States Patent
Ebrom et al.

(10) Patent No.: US 9,982,866 B2
(45) Date of Patent: May 29, 2018

(54) CONSOLE ASSEMBLY WITH INTEGRATED LIGHT REFLECTOR CUPS

(71) Applicant: WHIRLPOOL CORPORATION, Benton Harbor, MI (US)

(72) Inventors: Matthew P. Ebrom, Holland, MI (US); Eric J. Schuh, Stevensville, MI (US); Sithaarth T. Subramaniyam, Saint Joseph, MI (US); Sugosh Venkataraman, Stevensville, MI (US); Udayakumar Arumugam, Kilpennathur (IN); Guilherme Martinhon, Rio Claro (BR)

(73) Assignee: Whirlpool Corporation, Benton Harbor, MI (US)

( * ) Notice: Subject to any disclaimer, the term of this patent is extended or adjusted under 35 U.S.C. 154(b) by 82 days.

(21) Appl. No.: 15/073,889

(22) Filed: Mar. 18, 2016

(65) Prior Publication Data

US 2016/0201877 A1    Jul. 14, 2016

Related U.S. Application Data

(63) Continuation-in-part of application No. 14/065,721, filed on Oct. 29, 2013, now abandoned.

(51) Int. Cl.
| | |
|---|---|
| F21V 23/06 | (2006.01) |
| F21V 7/00 | (2006.01) |
| F21V 17/16 | (2006.01) |
| F21V 33/00 | (2006.01) |
| G09F 9/302 | (2006.01) |
| G09F 13/06 | (2006.01) |
| H05K 1/02 | (2006.01) |

(Continued)

(52) U.S. Cl.
CPC .......... *F21V 7/0008* (2013.01); *F21V 7/0083* (2013.01); *F21V 17/164* (2013.01); *F21V 33/0044* (2013.01); *G09F 9/302* (2013.01); *G09F 13/06* (2013.01); *G09F 23/0058* (2013.01); *H05K 1/0274* (2013.01); *F21W 2131/30* (2013.01); *F21Y 2115/10* (2016.08); *F24C 7/086* (2013.01); *H05K 2201/09063* (2013.01); *H05K 2201/09072* (2013.01); *H05K 2201/10106* (2013.01); *H05K 2201/10128* (2013.01)

(58) Field of Classification Search
CPC .................................. G09F 9/33; G09F 9/302
USPC .......... 40/451, 450, 570, 452, 579, 580, 544
See application file for complete search history.

(56) References Cited

U.S. PATENT DOCUMENTS

| | | |
|---|---|---|
| 3,858,341 A | 1/1975 | Wakabayashi |
| 4,818,980 A | 4/1989 | Strosser et al. |

(Continued)

FOREIGN PATENT DOCUMENTS

| | | |
|---|---|---|
| EP | 2481602 A1 | 8/2012 |
| EP | 2869675 A1 | 5/2015 |

OTHER PUBLICATIONS

New Appliance Panel Decorating Solutions at http://digital.bnpmedia.com/article/New+Appliance+Panel+Decorating+Solutions/1264696/0/article.html, appliance DESIGN, John Kaverman, Jan. 2013.

*Primary Examiner* — Kristina N Junge

(57) ABSTRACT

A console assembly for an appliance has a console shell having a front surface with integrated light reflector cups, and a printed circuit board (PCB) mounted to the console shell and having light emitting diodes (LEDs) emitting light into at least some of the integrated light reflector cups.

20 Claims, 6 Drawing Sheets

(51) Int. Cl.
*G09F 23/00* (2006.01)
*F21W 131/30* (2006.01)
*F24C 7/08* (2006.01)
*F21Y 115/10* (2016.01)

(56) References Cited

U.S. PATENT DOCUMENTS

| | | | |
|---|---|---|---|
| 4,990,772 A | 2/1991 | Rosenthal | |
| 5,105,568 A | 4/1992 | Branning | |
| 5,521,345 A | 5/1996 | Wulc | |
| 5,833,903 A | 11/1998 | Centofante | |
| 6,137,224 A | 10/2000 | Centofante | |
| 6,280,054 B1 | 8/2001 | Cassarly et al. | |
| 6,508,562 B1 | 1/2003 | Venkatram et al. | |
| 6,617,786 B1 | 9/2003 | Centofante | |
| 7,517,103 B2 | 4/2009 | Furuya et al. | |
| 7,968,795 B2 | 6/2011 | Yang | |
| 8,136,960 B2 * | 3/2012 | Wu | G09F 9/33 313/512 |
| 8,485,709 B2 * | 7/2013 | Wan | A47L 15/4293 362/23.01 |
| 8,530,742 B2 | 9/2013 | Hite et al. | |
| 8,807,770 B2 * | 8/2014 | Didat | H05K 1/183 362/458 |
| 9,035,178 B2 | 5/2015 | Gerstner et al. | |
| 9,220,394 B2 | 12/2015 | Heater et al. | |
| 2002/0024808 A1 | 2/2002 | Suehiro et al. | |
| 2003/0002281 A1 | 1/2003 | Suehiro | |
| 2011/0181516 A1 | 7/2011 | Mallory et al. | |
| 2015/0049455 A1 | 2/2015 | Heater et al. | |
| 2015/0113841 A1 | 4/2015 | Ebrom et al. | |

\* cited by examiner

US 9,982,866 B2

CONSOLE ASSEMBLY WITH INTEGRATED LIGHT REFLECTOR CUPS

CROSS-REFERENCE TO RELATED APPLICATION

This application is a continuation-in-part of pending U.S. patent application Ser. No. 14/065,721, filed Oct. 29, 2013, which is incorporated herein by reference in its entirety.

BACKGROUND OF THE INVENTION

Home appliances are increasingly equipped with a greater number of user-selectable features, typically presented via a user interface. An appliance may have a console assembly with the user interface or control panel provided thereon for selecting or setting one or more of the user-selectable features. The user interface may be coupled to a controller. The console assembly may include illuminated display elements that encode and present information to the user.

BRIEF DESCRIPTION

In one aspect, an embodiment of the disclosed technology relates to a console assembly for a laundry treating appliance comprising a console shell having a front surface with integrated light reflector cups, and a printed circuit board (PCB) mounted to the console shell and having light emitting diodes (LEDs) emitting light into at least some of the integrated light reflector cups.

In another aspect, an embodiment of the disclosed technology relates to a household appliance comprising a cabinet defining a treating chamber, a console provided on the cabinet and having a surface with integrated light reflector cups, a printed circuit board (PCB) mounted to the console shell and having light emitting diodes (LEDs) emitting light into at least some of the integrated light reflector cups, and a fascia overlying the PCB with transparent portions aligned with the cups.

DESCRIPTION OF EMBODIMENTS OF THE INVENTION

Figure 1:
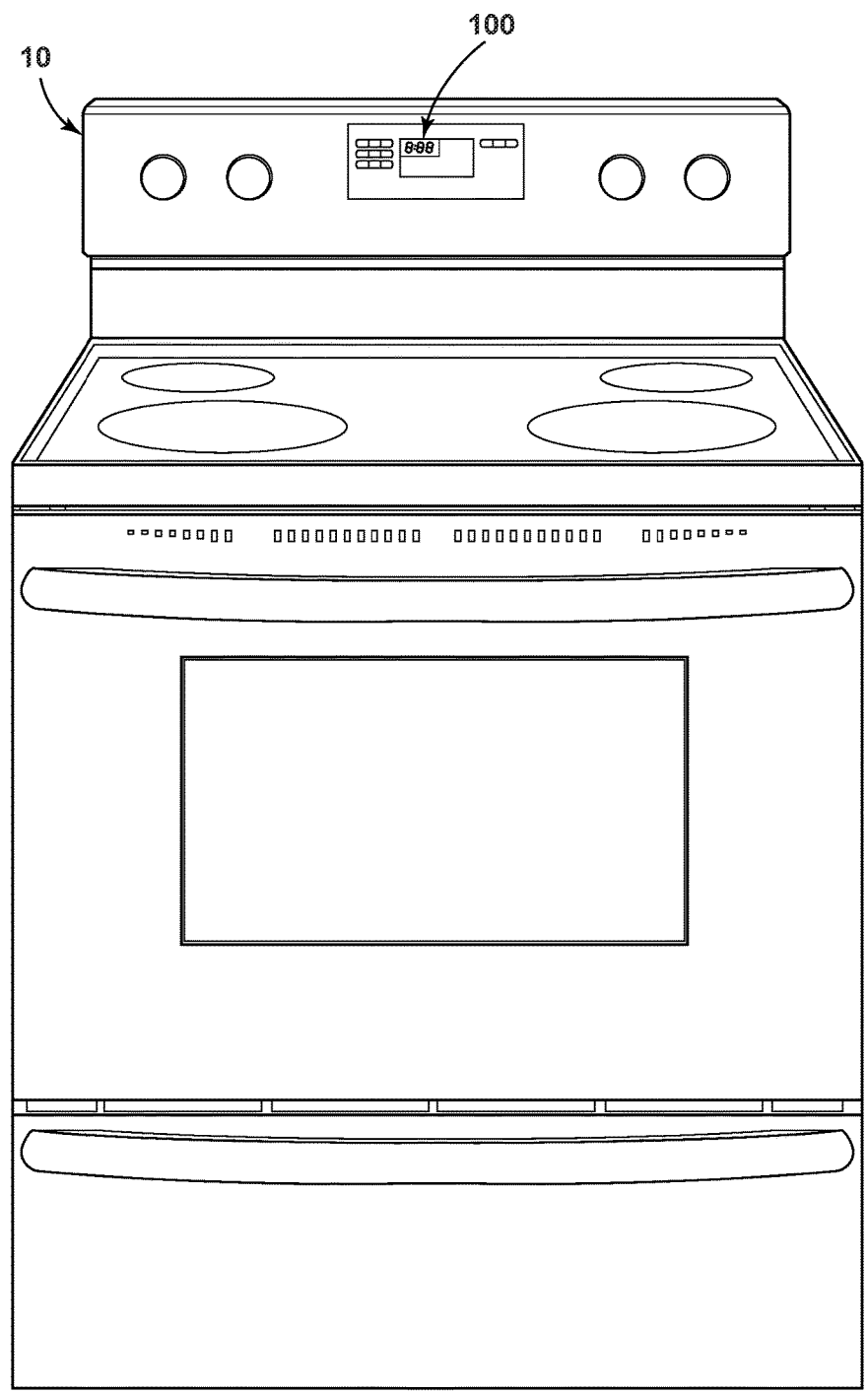
FIG. 1 depicts a front perspective view of an appliance in the form of a range having an example embodiment of the alphanumeric display assembly.

FIG. 1 depicts a front perspective view of an appliance in the form of a range 10 having an example embodiment of an alphanumeric display assembly 100. As illustrated, the appliance 10 may be a range, although the alphanumeric display assembly 100 may be included in other types of appliances, non-limiting examples of which may include clothes dryers, laundry drying machines, tumbling or stationary refreshing/revitalizing machines, extractors, non-aqueous washing apparatus, dishwashers, refrigerators, freezers, conventional ovens, microwave ovens, stoves, beverage dispensers, and washing machines. The alphanumeric display assembly also may be used in environments other than household appliances and generally applies to any electronic display of alphanumeric indicia, such as clocks, timers, calculators, enumerators, and the like.

The alphanumeric display assembly 100 is a type of display that includes an array of segments that may be independently illuminated. The segments of the display may be illuminated in different combinations. The combinations of illuminated segments are selected to produce numerals or letters.

Figure 2:
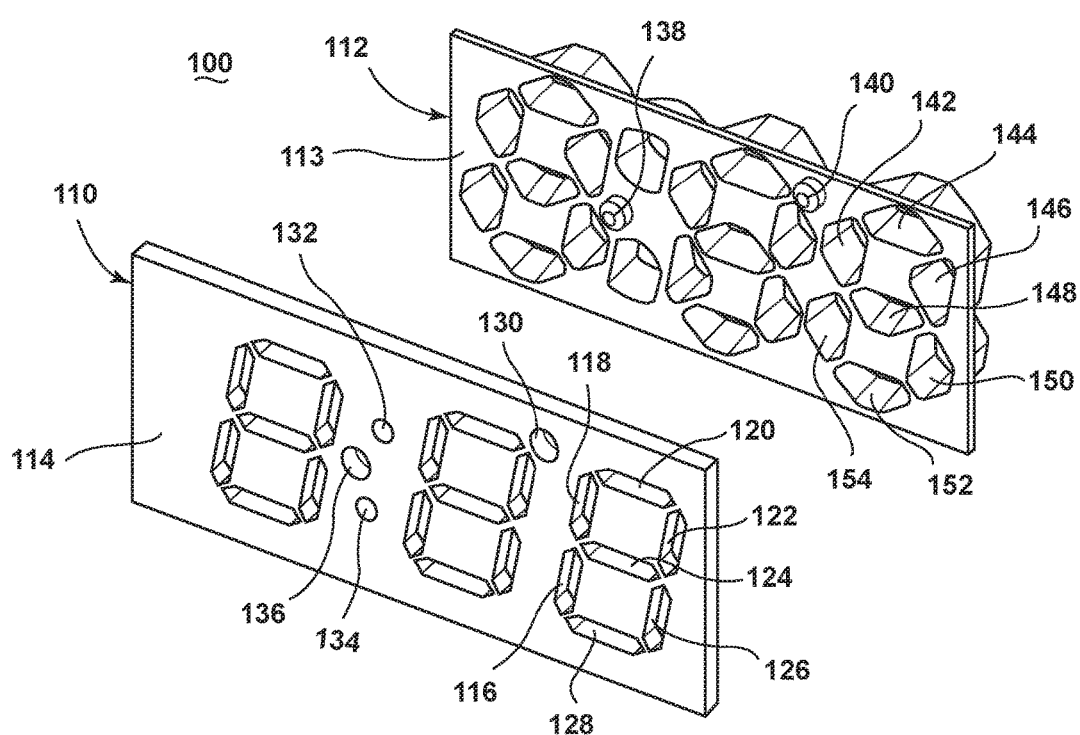
FIG. 2 depicts an exploded perspective view of the front of the alphanumeric display assembly of FIG. 1.

FIG. 2 depicts an exploded perspective view of the front of the alphanumeric display assembly 100 of FIG. 1. The alphanumeric display assembly 100 includes a printed circuit board (PCB) 110 and a light reflector 112. With respect to the viewable side of the alphanumeric display assembly 100, the light reflector 112 is placed behind the PCB 110.

The PCB 110 has a front side 114 that includes a plurality of holes 116-128, 132 and 134 extending through the PCB 110. The holes 116-128 are arranged to form an alphanumeric indicium (sometimes commonly referred to as a 7-segment display, where each hole forms a segment of the alphanumeric indicium). In most applications, the segments (formed from the holes 116-128) are of nearly uniform shape and size and are usually formed as elongated hexagons, though trapezoids and rectangles may alternatively be used. As shown, there may be more than one alphanumeric indicium to complete the display, such as three indicia to display three numerals or letters, each alphanumeric indicium being identical to the others as disclosed herein. The holes 132, 134 are arranged to form a colon, as for use in a clock display. One or more holes may be disposed to form a decimal, as for use in a calculator. Additional holes in the PCB such as bores 130, 136 may aid in the attachment of the light reflector 112 to the PCB 110.

The PCB 110 may include multi-layered circuits with electric components such as integrated circuits (ICs), capacitors, resistors, or inductors, mounted on or embedded into the multi-layered circuits. As described below, the PCB may also include one or more illumination devices including light emitting diodes (LEDs), liquid crystal displays (LCDs) or vacuum fluorescent displays (VFDs). Additional elements may be mounted to PCB 110. For example, one or more touch circuits (not shown) may be mounted to the front side 114 of the PCB 110.

The light reflector 112 may be positioned adjacent to the PCB 110 for directing illumination towards the user. As illustrated, the light reflector 112 may be disposed immediately adjacent to the PCB 110. Preferably, the light reflector 112 is a molded thermoplastic. Other compositions of materials for the light reflector 112 are contemplated and include, but are not limited to: stamped metal, highly reflective aluminized polyethylene terephthalate (PET), molded or formed glass, plate glass, dielectric mirrors, reflective plastic or any other material. Additionally, the material may be coated in whole or in part with one or more reflective materials that may include sputtered aluminum powder, silver coating, silkscreen, metal deposition, reflective paint, etc.

The light reflector 112 may include a first side 113 where a plurality of light cups 140-154 may be disposed on the first side 113 of the light reflector 112. The light cups 140-154 may be in the form of an extruded multi-faceted cavity, each positioned to enclose one of the plurality of holes 116-128, 132 and 134 extending through the PCB 110 and a corresponding illumination device described below. Each of the plurality of holes 116-128, 132 and 134 and its corresponding illumination device is received in the space defined by one of the three dimensional light cups 140-154 when the light reflector 112 is aligned to the PCB 110.

The reflecting cups may comprise acrylonitrile butadiene styrene (ABS). Another material such as polypropylene (PP), polycarbonate (PC), or polystyrene (PS) may be used for the light reflector 112. Also, the reflecting cups may include flame retardant acrylonitrile butadiene styrene (FR ABS), Polyvinyl Chloride (PVC), or flame retardant polycarbonate/acrylonitrile butadiene styrene (FR PC-ABS).

Figure 3:
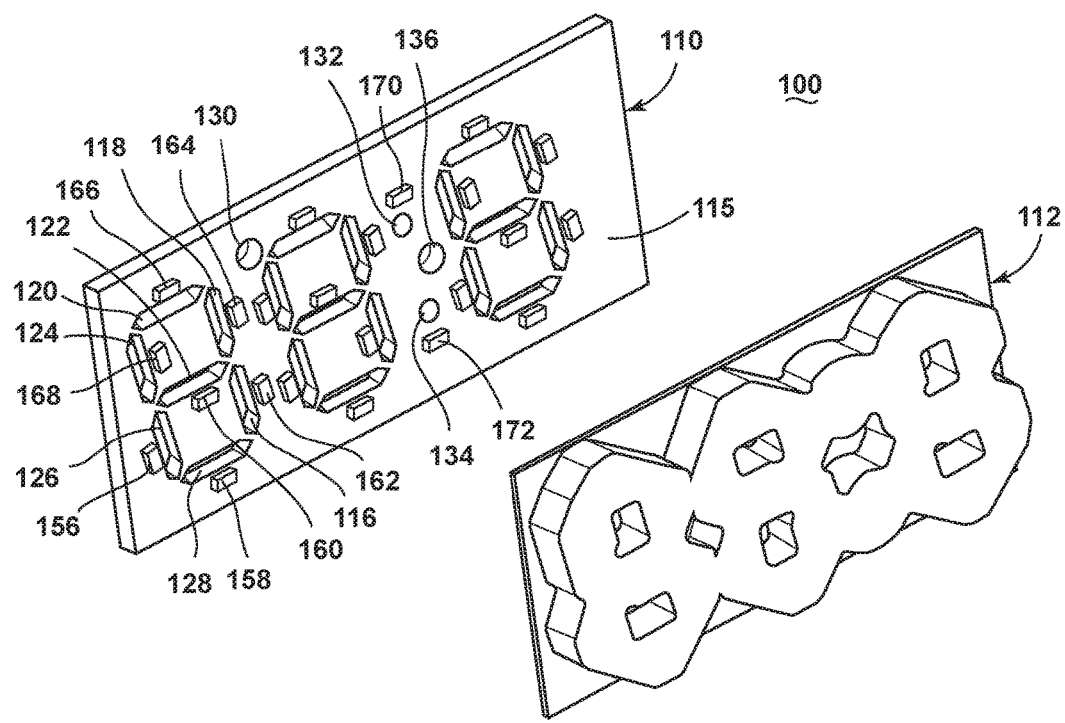
FIG. 3 depicts an exploded perspective view of the rear of the alphanumeric display assembly of FIG. 1.

The light reflector 112 may further include one or more bosses 138, 140 to be used as fasteners. The aforementioned bores 130, 136 may receive the bosses 140, 138 respectively and effect a connection to secure the light reflector 112 to the PCB 110. The light reflector 112 is mounted to the rear side of the PCB and may be secured by the fastener connection that includes the bosses 140, 138 received in the bores 130, 136. Other mounting techniques are contemplated and may include welding, adhesive, soldering onto metal leads that are molded onto the light reflector 112. Alternatively, the light reflector 112 may be packaged in a tape-and-reel mechanism and mounted into position by a pick-and-place machine FIG. 3 depicts an exploded perspective view of the rear of the alphanumeric display assembly 100 of FIG. 1. Mounted to the rear side 115 of the PCB 110, a plurality of LEDs 156-172 are configured such that at least one LED is mounted adjacent to each hole 116-128, 132, and 134. Each light reflecting cup covers at least one LED and the adjacent hole. In this way, each light reflecting cup is spaced from at least one LED and its adjacent hole to reflect light from the LEDs through the holes so each alphanumeric indicium is visible from the front side 114 of the PCB 110.

It is noted that, in addition to the illumination devices shown as the LEDs 156-172, other electronic components may be mounted to the rear side 115 of the PCB 110. For example, one or more components such as capacitors, resistors, connectors, and the like, may be mounted to the rear side 115 of the PCB 110 for operating touch circuits or illumination devices.

With regard to the operation of the alphanumeric display assembly 100, each LED and corresponding hole may be confined within the space formed by the three dimensional wall of the corresponding light cup. When each LED is selectively activated, the light from each LED may be supplied toward a wall of the light cup and then reflected by the wall toward the hole. Some of the reflected light may pass through the hole without being retarded by any light blocking medium. The reflected light may further pass through the thickness of the PCB 110 to reach to the user. It may be understood that the intensity and area of the reflected illumination through the hole may be determined by at least one of the location of the LED relative to the light cup, the geometrical parameters of the light cup, the size and location of the hole and the thickness of the PCB.

While described above in the context of a seven-segment display, the PCB 110 may include other arrangements of holes along with corresponding LEDs and associated light cups to produce other alphanumeric displays. Typical alphanumeric displays include seven-segment displays, nine-segment displays, fourteen-segment displays and sixteen segment displays. As with the holes 132, 134 arranged to form a colon, the PCB 110 may include other holes along with corresponding LEDs and associated light cups to produce additional symbols. Typical symbols associated with segmented displays include the colon, the comma, and the decimal point. Multiple alphanumeric displays may be configured to act as a single display units. For example, as shown in the figures, three seven segment displays may form a single display unit.

By provision of a light cup or a light reflector with an array of light cups, the alphanumeric display assembly may achieve a desirably bright output light intensity by direct reflection of the light from an LED off the light cup and through the hole in the PCB. The light reflector may be manufactured in a cost efficient manner that far exceeds alternative methods. For example, encapsulation of the LED with a resin to serve as a waveguide to direct the light through the hole may be costly and time-consuming and may result in a less appealing or less bright display over time as the encapsulant ages and discolors.

Figure 4:
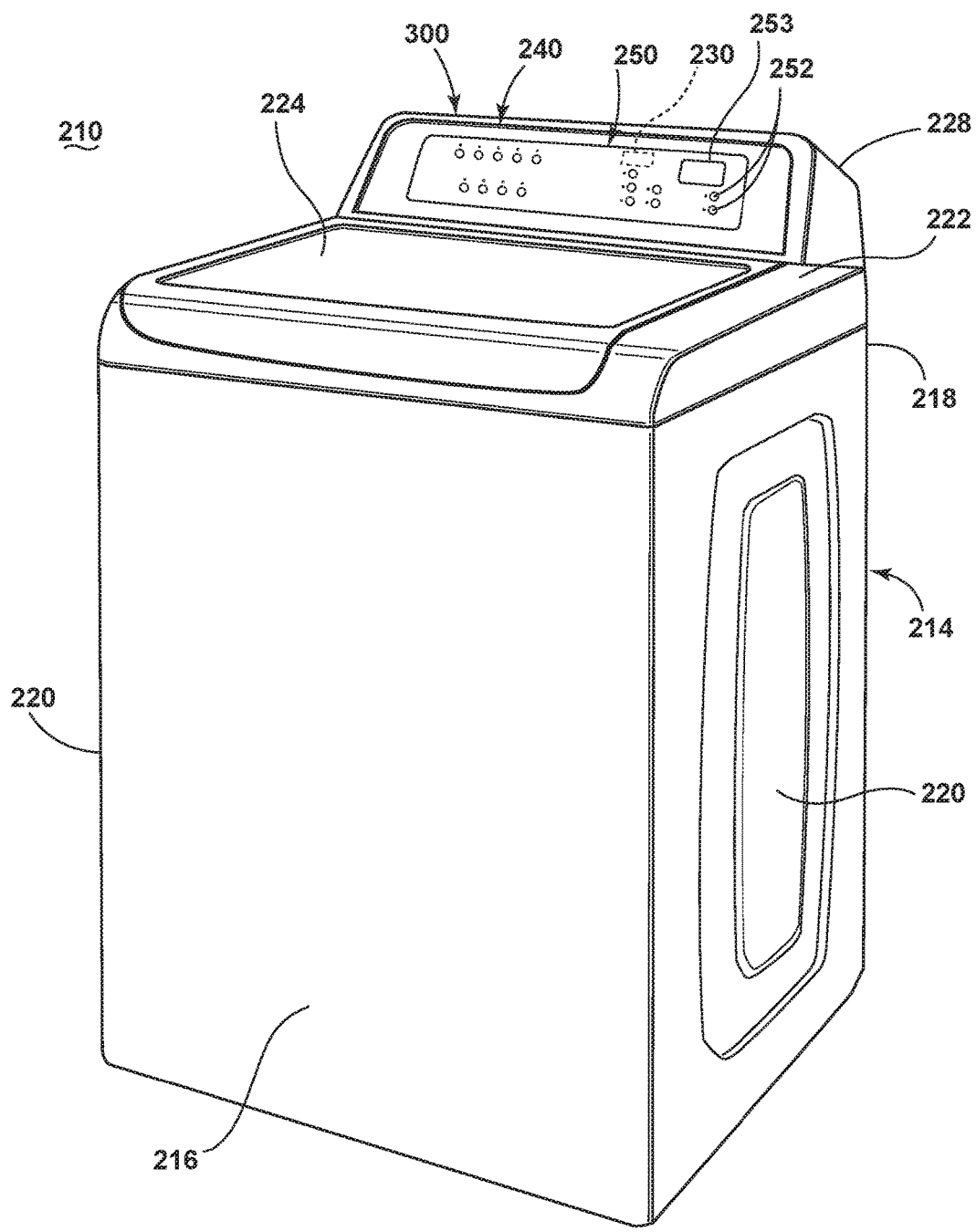
FIG. 4 depicts a front perspective view of an appliance in the form of a laundry treating appliance having an example embodiment of a console assembly.

FIG. 4 depicts a front perspective view of a household appliance in the form of a laundry treating appliance 210, which includes an example embodiment of a console assembly 300. It will be understood that the console assembly 300 may be included in other types of household appliances for performing a useful cycle of operation on a physical article including, but not limited to, clothes dryers, laundry drying machines, tumbling or stationary refreshing/revitalizing machines, extractors, non-aqueous washing apparatus, dishwashers, refrigerators, freezers, conventional ovens, microwave ovens, stoves, ranges, beverage dispensers, and washing machines. The console assembly 300 also may be used in environments other than household appliances and generally applies to any electronic display of LEDs, such as clocks, timers, calculators, enumerators, and the like.

A structural support system of the laundry treating appliance 210 can include a cabinet 214 defined by a front wall 216, a rear wall 218, and a pair of side walls 220 supporting a top wall 222. The cabinet 214 may be a housing having a chassis and/or a frame, defining an interior enclosing components typically found in a conventional laundry treating appliance such as a washing machine, such as motors, pumps, liquid supply system, dispensing system, recirculation and drain system, drive system, sensors, transducers, and the like. Such components will not be described further herein except as necessary for a complete understanding of the invention.

A door 224 may be hingedly mounted to the top wall 222 and may be selectively movable between opened and closed positions to close an opening in the top wall 222, which provides an access to the interior of the cabinet 214. A treating chamber (not shown) may be disposed within the interior of the cabinet 214 and can be defined in part by the cabinet 214. The top wall 222 may support or be formed with a backsplash 228.

The laundry treating appliance 210 may further include a control system for controlling the operation of the laundry treating appliance 210 to implement one or more cycles of operation. The control system may include a controller 230 located in the cabinet 214 of the backsplash 228 and the console assembly 300 that is operably coupled with the controller 230.

The console assembly 300 may be provided on an exterior portion of the laundry treating appliance 210, such as on the front wall 216 or the cabinet 214 or, as illustrated, on the backsplash 228. As illustrated, the console assembly 300 may be integrated with the backsplash 228. Alternately, the console assembly 300 may be a separate piece from the backsplash 228. It is also contemplated that the console assembly 300 can be provided along at least one of a front or rear edge of the top surface of the cabinet 214, along a front of the cabinet 214, or be provided on the door 224.

The console assembly 300 may be operably coupled with the controller 230 for selecting and/or setting one or more user-selectable features or parameters. The particular user-selectable parameters will vary depending on the laundry treating appliance 210. For the laundry treating appliance 210, illustrated in FIG. 4, examples of user-selectable parameters may include cycle type (such as a normal, power wash, hand wash, wrinkle control, or heavy duty cycle), load size (such as small, medium, or large load), and fabric color (such as whites or colors).

The console assembly 300 can also include a fascia 240 with an interface 250 provided on the front surface of the fascia 240. Within the interface 250 are disposed multiple indicia 252 representing the user-selectable parameters. The fascia 240 may be an in-mold label, an in-mold decoration, printed glass, or the like; it is important that the fascia 240 be light transmissive, such that the fascia 240 is capable of allowing light to be transmitted through it. In one embodiment, the fascia 240 has transparent portions. It is also contemplated that the fascia 240 can at least partially comprise a translucent, tinting, or filtering layer or portion, in place of or in addition to the transparent portions, in order to improve the visibility of certain display segments. The tinting or filtering layer or portions can be included as an integral part of the fascia 240 or as an independent insert positioned directly behind the fascia 240. The indicia 252 (FIG. 4) can include parameter selectors such that a user can enter different types of information including, without limitation, cycle selection, and cycle parameters, such as cycle options. The indicia 252 can include one or more buttons for selecting and/or setting one or more of the user-selectable parameters indicated.

The fascia 240 can further include a display panel 253 for selecting and/or displaying one or more of the user-selectable parameters indicated by additional indicia or status of a cycle of operation. One or more parameter buttons may be coupled to the front side of the fascia 240. Alternatively, it is also possible that the front surface of the fascia 240 can be provided entirely with multiple indicia or other selectors that are co-planar with the front surface of the fascia 240 such that no components protrude from the front surface of the fascia 240. The indicia 252 can further include a strip display for setting and/or displaying one or more of the user-selectable parameters. It may be understood that the display panel or strip display may include one or more illumination devices emanating a variety of colors and/or intensities for setting and/or displaying one or more of the user-selectable parameters.

Figure 5:
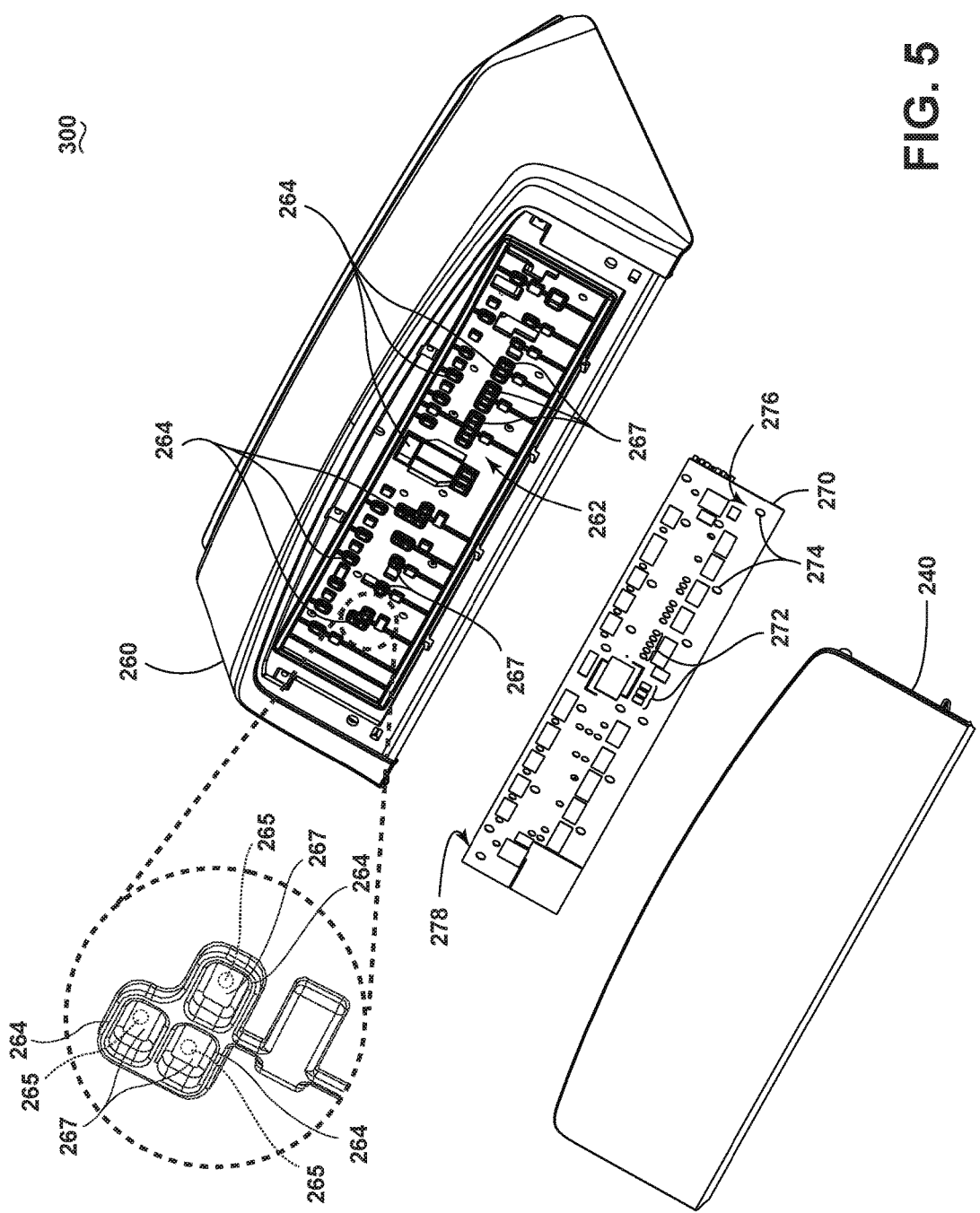
FIG. 5 depicts an exploded front perspective view of an example embodiment of the console assembly of the laundry treating appliance of FIG. 4.

FIG. 5 depicts an exploded front perspective view of an embodiment of the console assembly 300 of the laundry treating appliance 210 of FIG. 4. The console shell 260 can be operably coupled to the rear side of the fascia 240 to provide mechanical support to the fascia 240. The console shell 260 may be integrated to the fascia 240 by an attachment means which can include fasteners including, but not limited to, screws, bolts or nuts, heat staking, welding, snap fit, gluing, and the like. There can also be provided a printed circuit board (PCB) 270 that is positioned between the console shell 260 and the fascia 240.

The console shell 260 has a front surface 262 that is provided with a plurality of integrated light reflector cups 264. While the plurality of integrated light reflector cups 264 are illustrated as extruded multi-faceted cavities, it is also contemplated that they can be in the form of hollow domes, each positioned to enclose a corresponding illumination device, shown here as light emitting diodes (LEDs) 265, described below. Preferably, the front surface 262 of the console shell 260 that houses the integrated light reflector cups 264 is a molded thermoplastic and the integrated light reflector cups 264 are co-molded with the console shell 260 to integrally form the light reflector cups 264 with the console shell 260. Other compositions of materials for the front surface 262 of the console shell 260 are contemplated and include, but are not limited to: stamped metal, highly reflective aluminized polyethylene terephthalate (PET), molded or formed glass, plate glass, dielectric mirrors, reflective plastic or any other material. Additionally, the material may be coated in whole or in part with one or more reflective materials, in order to enhance the amount of reflected light, that may include, but is not limited to, sputtered aluminum powder, silver coating, silkscreen, metal deposition, reflective paint, etc. The integrated light reflector cups 264 can include acrylonitrile butadiene styrene (ABS). Also, the integrated light reflector cups 264 may include acrylonitrile butadiene styrene (ABS), Polyvinyl Chloride (PVC), or polycarbonate/acrylonitrile butadiene styrene (PC-ABS).

Figure 6:
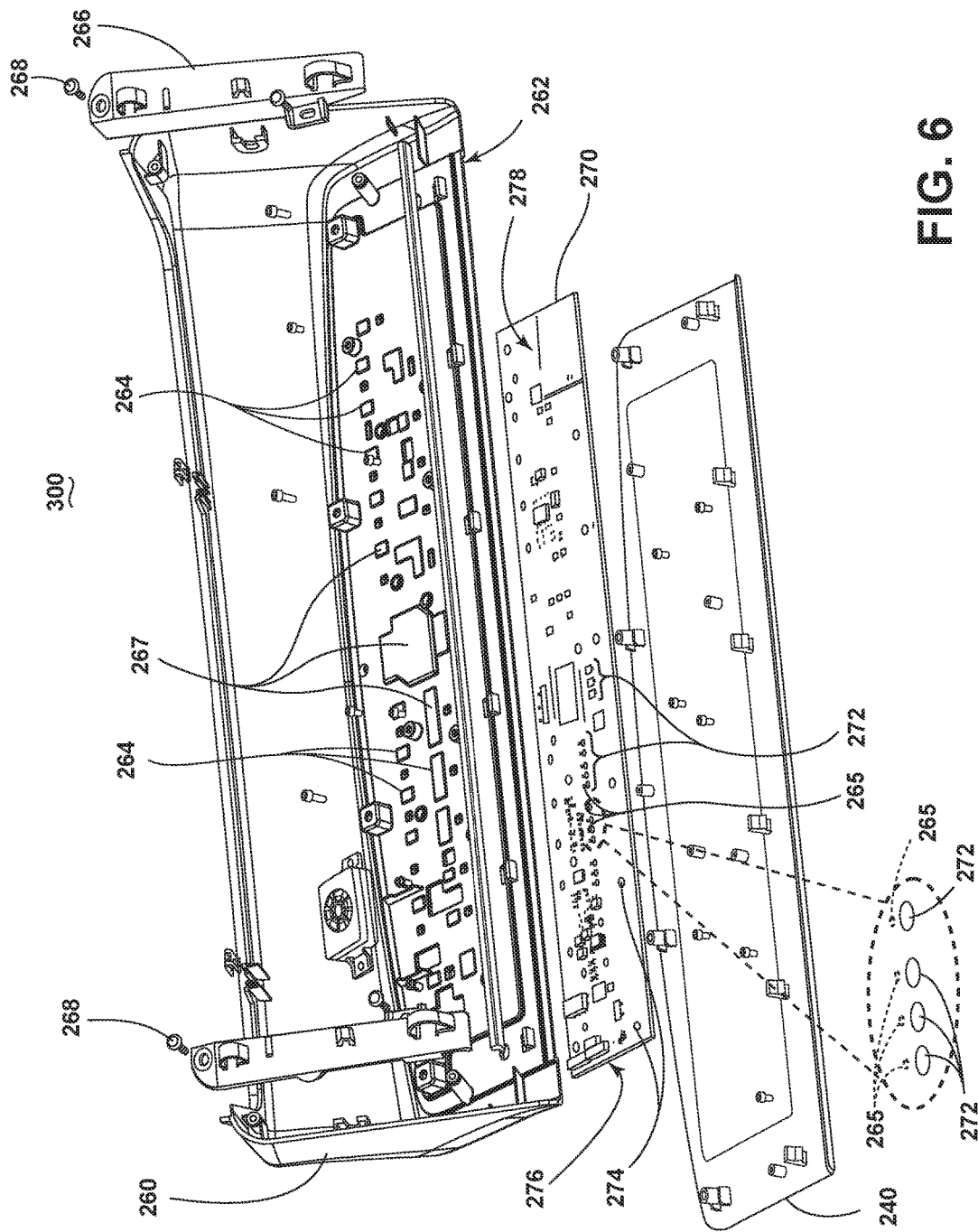
FIG. 6 depicts an exploded perspective view of the rear of the example embodiment of the console assembly of FIG. 5.

FIG. 6 is an exploded perspective view of the rear of the console assembly 300 of FIG. 5. The console assembly 300 can include the fascia 240, a printed circuit board (PCB) 270, the console shell 260, and a console mount 266. The console mount 266 attaches the console assembly 300 to the cabinet 214 of the laundry treating appliance 210 by any suitable attachment means, which can include the use of screws 268. The fascia 240 can be attached to at least one of the PCB 270 or the console shell 260 through the use of snap fasteners, although any suitable fastening method may alternatively be used.

With respect to the viewable side of the console assembly 300, the integrated light reflector cups 264 are placed behind the PCB 270. The PCB 270 has a front surface 276 that includes a plurality of openings 272 extending through the PCB 270. In most applications, the openings 272 are of nearly uniform shape and size and are usually formed as squares, though any suitable shape may alternatively be used. Additional openings in the PCB 270 such as bores 274 may aid in the attachment of the PCB 270 to the console shell 260. It is further contemplated that snap fasteners can be used to connect the PCB 270 to the console shell 260.

Mounted to the rear surface 278 of the PCB 270, confronting the front surface 262 of the console shell 260, a plurality of light emitting diodes (LEDs) 265 are configured such that at least one LED 265 is mounted adjacent to each opening 272. The integrated light reflector cups 264 of the console shell 260 are positioned adjacent to the PCB 270 for directing illumination towards the user. As illustrated, the console shell 260 provided with the integrated light reflector cups 264 is disposed immediately adjacent the PCB 270. Each integrated light reflector cup 264 covers at least one LED 265 and the adjacent opening 272. Each integrated light reflector cup 264 is spaced from and positioned to enclose at least one LED 265 and its adjacent opening 272 extending through the PCB 270 to reflect light from the LEDs 265 through the openings 272 so each indicium is visible from the front surface 276 of the PCB 270. In this way, each of the plurality of openings 272 and its corresponding LED 265 is received in the space defined by one of the three-dimensional integrated light reflector cups 264 when the console shell 260 is aligned to the PCB 270. Furthermore, each of the openings 272 of the PCB 270 are aligned with transparent, translucent, tinting, or filtering portions of the fascia 240 so that each indicium is visible to the user from the front surface of the fascia 240.

The PCB 270 may include multi-layered circuits with electric components such as integrated circuits (ICs), capacitors, resistors, or inductors, mounted on or embedded into the multi-layered circuits. As described above, the PCB may also include one or more illumination devices including light emitting diodes (LEDs) 265, liquid crystal displays (LCDs) or vacuum fluorescent displays (VFDs). Additional elements may be mounted to PCB 270. For example, one or more touch circuits (not shown) may be mounted to the front surface 276 of the PCB 270.

With regard to the operation of the console assembly 300, each LED and corresponding opening 272 may be confined within the space formed by the three dimensional wall 267 of the corresponding integrated light reflector cup 264. When each LED 265 is selectively activated, the emitted light from each LED 265 may be supplied toward a wall 267 of the integrated light reflector cup 264 and then reflected by the wall 267 toward the opening 272. Some of the reflected light may pass through the opening 272 without being retarded by any light blocking medium. The reflected light may further pass through the thickness of the PCB 270 to reach to the user. It may be understood that the intensity and area of the reflected illumination through the opening 272 may be determined by at least one of the location of the LED 265 relative to the integrated light reflector cup 264, the geometrical parameters of the integrated light reflector cup 264, the size and location of the opening, and the thickness of the PCB 270.

By provision of an integrated light reflector cup or an array of integrated light reflector cups, the console assembly may achieve a desirably bright output light intensity by direct reflection of the light from an LED off the integrated light reflector cup and through the opening in the PCB. The integrated light reflector cup may be manufactured in a cost efficient manner that far exceeds alternative methods. For example, encapsulation of the LED with a resin to serve as a waveguide to direct the light through the opening may be costly and time-consuming and may result in a less appealing or less bright display over time as the encapsulant ages and discolors.

The aspects disclosed herein provide a variety of benefits over current interfaces and display assemblies. More specifically, current interfaces and display assemblies include at least three main parts, including a fascia, which includes the decoration, a PCB assembly, and a reflector cup part. Some may also contain gaskets, speakers, encoders, etc. Such main parts can be built in different locations and can require some complex logistics to reach a central site for integration, where the assembly sequence includes fascia inspection, fastening of the PCB to the fascia, fastening of the reflector cup part to the fascia, and subsequent attachment to the console shell. The aspects described herein integrate the reflector cup part to the console shell, making it as a single part. This will reduce parts complexity since one part is being eliminated, and can also improve assembly timing, including reduction of labor costs. Potentially, it can improve quality of the assembly as well.

To the extent not already described, the different features and structures of the various embodiments may be used in combination with each other as desired. That one feature may not be illustrated in all of the embodiments is not meant to be construed that it may not be, but is done for brevity of description. Thus, the various features of the different embodiments may be mixed and matched as desired to form new embodiments, whether or not the new embodiments are expressly described. All combinations or permutations of features described herein are covered by this disclosure. As examples, the shape and geometrical dimension of integrated light reflector cups, openings, or holes may be varied to provide controlled illumination to the user. Each light cup may be individually shaped and mounted to the PCB to cover a single hole and adjacent LED. Each integrated light reflector cup may be individually shaped within the console shell to cover a single opening and adjacent LED. While described in the context of mounting the light reflector to the PCB or integrating the light reflector cups to the console shell, the light reflector, light reflector cups, or any of the light cups may be mounted or integrated into any additional component such that the light reflector or light reflector cups is or are placed in proximity to the PCB and the light cups may reflect light illuminated from the LEDs through the holes or openings in the PCB. The light cups or light reflector cups may have additional reflective properties added, such as a polished surface, a metallic surface, a colored surface, and/or a surface formed to reflect light a given wavelength.

While the invention has been specifically described in connection with certain specific embodiments thereof, it is to be understood that this is by way of illustration and not of limitation. Reasonable variation and modification are possible within the scope of the forgoing disclosure and drawings without departing from the spirit of the invention which is defined in the appended claims.

What is claimed is:

1. A console assembly for a laundry treating appliance, comprising:
    a console shell having a front surface with co-molded, integrally formed light reflector cups; and
    a printed circuit board having a front side and a rear side, spaced and opposite from the front side, the rear side of the printed circuit board mounted to the console shell and the rear side of the printed circuit board having a set of light emitting diodes operably coupled thereto emitting light into at least some of the integrated light reflector cups and wherein the printed circuit board has a set of openings extending between the front side and the rear side adjacent the light emitting diodes and wherein the openings are aligned with at least some of the light reflector cups such that the light is reflected by the cups through the openings; and
    a fascia having a front surface and a rear surface and where the front side of the printed circuit board is mounted to the rear surface of the fascia;
    wherein a light reflector cup of the console shell is positioned to enclose one of the set of light emitting diodes and one of the set of openings.

2. The console assembly of claim 1 wherein the fascia includes transparent, translucent, tinting, or filtering portions aligned with at least some of the set of openings.

3. The console assembly of claim 2, further comprising snap fasteners connecting the fascia to at least one of the printed circuit board or console shell.

4. The console assembly of claim 1, further comprising snap fasteners connecting the printed circuit board to the console shell.

5. The console assembly of claim 1 wherein at least one of the light reflector cups includes a multi-faceted cavity.

6. The console assembly of claim 5 wherein the multi-faceted cavity comprises a wall configured to reflect the emitted light toward the one of the set of openings.

7. The console assembly of claim 6 wherein the emitted light passes through the one of the set of openings without being retarded by any light blocking medium.

8. The console assembly of claim 1, further comprising a console mount operably coupled to a portion of the console shell and configured to couple to a laundry treating appliance.

9. The console assembly of claim 1 wherein the light reflector cups comprises a set of walls extending from the front surface.

10. A household appliance for performing a useful cycle of operation on a physical article comprising:
- a cabinet;
- a console provided on the cabinet and having a console shell having a front surface with co-molded, integrally formed light reflector cups;
- a printed circuit board having a front side and a rear side, spaced and opposite from the front side, the rear side of the printed circuit board mounted to the console shell and rear side of the printed circuit board having a set of light emitting diodes emitting light into at least some of the integrated light reflector cups and wherein the printed circuit board has a set of openings extending between the front side and the rear side adjacent the light emitting diodes and wherein the openings are aligned with at least some of the light reflector cups such that the light is reflected by the cups through the openings; and
- a fascia having a front surface and a rear surface, where the front side of the printed circuit board is mounted to the rear surface of the fascia, and with the fascia including transparent, translucent, tinting, or filtering portions aligned with the light reflector cups;

wherein a light reflector cup of the console shell is positioned to enclose one of the set of light emitting diodes and one of the set of openings.

11. The household appliance of claim 10 wherein the printed circuit board has openings aligned with at least some of the integrated light reflector cups such that the emitted light is reflected by the light reflector cups through the openings.

12. The household appliance of claim 11 wherein the transparent, translucent, tinting, or filtering portions align with the openings.

13. The household appliance of claim 12, further comprising snap fasteners connecting the fascia to at least one of the printed circuit board or console shell.

14. The household appliance of claim 13 wherein the light emitting diode are located on a side of the printed circuit board confronting the front surface of the console shell.

15. The household appliance of claim 10 wherein the console is provided along at least one of a front or rear edge of a top surface of the cabinet.

16. The household appliance of claim 10 wherein the console is provided along a front of the cabinet.

17. The household appliance of claim 10 wherein the cabinet defines a chamber and further comprises a door for selectively closing the chamber.

18. The household appliance of claim 17 wherein the console is provided on the door.

19. The household appliance of claim 10 wherein at least one of the light reflector cups includes a multi-faceted cavity.

20. The household appliance of claim 10, further comprising a console mount attaching the console shell to the cabinet via one or more fasteners.

* * * * *